United States Patent
Meier et al.

(10) Patent No.: US 6,683,980 B1
(45) Date of Patent: Jan. 27, 2004

(54) SYSTEM AND METHOD FOR COMPRESSING DATA

(75) Inventors: Fabian W. Meier, San Francisco, CA (US); Francis S. Bernard, Fremont, CA (US)

(73) Assignee: Microsoft Corporation, Redmond, WA (US)

( * ) Notice: Subject to any disclaimer, the term of this patent is extended or adjusted under 35 U.S.C. 154(b) by 706 days.

(21) Appl. No.: 09/628,796

(22) Filed: Jul. 28, 2000

(51) Int. Cl.[7] .......................... G06K 9/36; H03M 7/40; H04N 7/15; H04N 7/12; H04N 11/02
(52) U.S. Cl. ................... 382/166; 382/246; 341/67; 375/240.23
(58) Field of Search ................... 382/166, 232, 382/238, 244, 246; 341/65, 67; 375/240, 240.23

(56) References Cited

U.S. PATENT DOCUMENTS

| | | | | |
|---|---|---|---|---|
| 5,432,871 A | * | 7/1995 | Novik | 382/232 |
| 5,708,511 A | * | 1/1998 | Gandhi et al. | 382/239 |
| 5,754,746 A | * | 5/1998 | Blurfrushan et al. | 358/1.15 |
| 5,880,856 A | * | 3/1999 | Ferriere | 358/426.11 |
| 5,966,465 A | * | 10/1999 | Keith et al. | 382/232 |
| 6,021,224 A | * | 2/2000 | Castelli et al. | 382/232 |
| 6,104,754 A | * | 8/2000 | Chujoh et al. | 375/240.23 |
| 6,148,028 A | * | 11/2000 | Kikuchi et al. | 375/240.16 |
| 6,510,177 B1 | * | 1/2003 | De Bonet et al. | 375/240.16 |

* cited by examiner

Primary Examiner—Jayanti K. Patel
Assistant Examiner—Christopher Sukhaphadhana
(74) Attorney, Agent, or Firm—Lee & Hayes, PLLC

(57) ABSTRACT

A system and method for compressing an image into bit streams allows data to be presented in either lossy or lossless quality. A lossy quality presentation results in some measurable degradation of an image's visual quality upon expansion. A lossless quality presentation displays the image in its original form. The method divides the image to be compressed into a plurality of regions. For each region, a plurality of adjacent pixels are selected and organized into a set. The corresponding sets for each respective region are identified as a group. The pixel sets within each group are encoded and arranged into two bit streams associated with each respective group. Next, each group's respective bit streams are written into a primary bit stream of constant size and possibly a supplemental bit stream of variable length for presenting the image in either lossy or lossless quality.

14 Claims, 9 Drawing Sheets

SYSTEM AND METHOD FOR COMPRESSING DATA

CROSS-REFERENCE TO RELATED APPLICATIONS

This application is related to commonly owned, co-pending application no. 09/628,658, filed on even data herewith, titled "System and Method for Storing Compressed Data onto a Storage Medium," the full text of which is incorporated herein by reference as if reproduced below.

BACKGROUND OF THE INVENTION

1. Field of the Invention

The present invention relates generally to the storage of data and, more particularly, to the compression, recording and playing of video data.

2. Related Art

Compression is the process of encoding an image such that it requires less space for storage. There are two fundamental ways to compress image data: lossy compression and lossless compression. Examples of lossy compression schemes include JPEG and MPEG. Lossy compression can provide a very high compression ratio. However, during the encoding process some data will be irreversibly lost. Consequently, a lossy encoded image will have some degradation of visual quality when expanded. Lempel-Ziv and Welch (LZW) encoding and Rice encoding are two well known lossless compression algorithms. Lossless compression usually results in compression ratios lower than those obtained with lossy compression. However, the benefit of compressing an image using a lossless compression scheme is that once expanded, the resulting image will be exactly as it was prior to being compressed.

Traditionally, with any compression algorithm, the compression ratio is data dependent. Accordingly, the compression ratio cannot be predicted. However, in certain instances, control of the compression ratio is desired. For example, a video cassette recorder (VCR) tape has a constant bandwidth capacity. Likewise, a hard disk array has a maximum data storage capacity; therefore, when recording data onto either storage device, it is highly desirable to control the compression ratio of the data. The importance of this control is even more evident when one considers the recent developments in the area of high definition television (HDTV).

As compared with conventional TV, HDTV signals have higher resolution and require more bandwidth for storage. For example, an HDTV image presented in 1080i format with 444 sampling and 8 bit resolution has a bandwidth of 1.5 Gbits/s. Present VCR tapes are unable to meet such storage demands. While recording devices and media (e.g., tapes, ROM cartridges, magnetic or optical disks) capable of recording HDTV images will be developed, compression will still be desirable, if not necessary.

A feature of HDTV is the high quality resolution of the images produced. Thus, any compromising of the visual image is not desirable. As already mentioned, lossy compression results in diminished video quality. Likewise, as one considers the bandwidth constraints imposed by storage media, it is evident that the use of a lossless compression scheme can also create problems. Consider the following explanation. The compressed bit streams of image sequences produced by lossless compression schemes often include bandwidth peaks. Bandwidth peaks are the result of producing a number of successive frames with a very low compression ratio. If the storage media, a VCR tape for example, lacked the capacity to store the bandwidth peak portions of the bit stream then the data would be lost. Buffering is used to avoid this scenario. Buffering, however, raises the potential for two additional problems: latency and buffer overflow, both of which result in lost data and/or diminished visual quality. Therefore, what is needed is a method for compressing data, in particular, high definition television image data, such that the resulting bit stream bandwidth is kept relatively constant and the image quality is not compromised. These results allow the bit streams to be recorded on a storage medium and viewed without diminished visual quality.

SUMMARY OF THE INVENTION

The present invention provides a system and method for recording data onto a storage medium such that it can be replayed to provide either a lossy quality or lossless quality presentation. Because there is some loss of visual integrity associated with a lossy presentation, this option is acceptable when the user intends to only preview the image or video sequence. The benefit of presenting a lossless quality presentation is that the decompressed image will be exactly the same as the original uncompressed image.

In order to view either lossy or lossless quality presentations, the compressed data must first be recorded onto a storage medium. Each image of a video sequence is processed by an encoder. The output of the encoder is a fixed length primary bit stream and a variable length supplemental bit stream. The size of the fixed length bit stream is chosen according to the write-bandwidth of the storage medium. As each of the primary bit streams are received, they are recorded directly onto the storage medium in real time. As each of the supplemental bit streams are received, they are written into temporary memory in real time. Once all of the primary bit streams are received and subsequently written onto the storage medium, the supplemental bit streams will be retrieved from the temporary memory and written onto the storage medium. After all of the bit stream data has been written onto the storage medium, a user can be prompted as to the mode of desired playback.

The viewing choices include either lossy quality or lossless quality. If the desired data presentation quality level is lossy then the primary bit stream of the saved compressed data is retrieved from the storage medium. The primary bit stream includes variable length portions and possibly fixed length portions of encoded data. The primary bit stream is provided to a decoder for decoding. If the desired data presentation quality level is lossless, then the supplemental bit stream will be retrieved first. The supplemental bit stream, which includes fixed length and possibly variable length data, is retrieved from the storage medium and written into temporary memory. Once all of the supplemental bit stream data has been written into temporary memory then both the primary bit stream data and the supplemental bit stream data is input into a decoder for decompression into lossless data.

Thus, the output from the decoder is either a presentation of the original image in lossy quality or lossless quality. The ability to choose the decoding quality makes this scheme a progressive image compression scheme.

The method for image compression (i.e., producing the primary and supplemental bit streams) comprises the steps of dividing the image into a plurality of regions. For each region, a plurality of adjacent pixels corresponding to one color component are selected and identified as a pixel sample set. Corresponding pixel sample sets from the plurality of regions are associated into a group.

For each selected pixel, a pixel value of the selected pixel is encoded to generate a fixed length token and a variable length token. The variable length tokens for each pixel value in the set are arranged to form a variable length token vector. Further, each of the fixed length tokens are arranged to associate each bit of a pixel value with corresponding bits of other pixel values within the set. A fixed length token vector is then formed from the corresponding bits of the plurality of fixed length tokens.

For each group, a first bit stream that includes the variable length token vector from each of the plurality of regions is formed. A second bit stream is also formed. This second bit stream includes the fixed length token vectors from each of the plurality of regions. Additionally, a primary bit stream of constant length is formed. If required, a supplemental bit stream of variable length will also be formed. Both the primary bit stream and the supplemental bit stream may include data from the first and second bit streams corresponding to each of the groups.

At a minimum, the primary bit stream will contain a portion of the variable length token vectors from each group. The variable length token vectors correspond to the more significant bits representing the compressed image or frame. Thus, the data in the primary bit stream is sufficient to provide a lossy quality presentation. The supplemental bit stream contains the remaining variable length and fixed length token vectors. By decoding the data from the supplemental bit stream and the primary bit stream together, a lossless quality presentation is obtained.

An advantage of the encoding method of the present invention is that it allows one part of the compressed bit stream to be kept constant in size by sacrificing image quality.

Another advantage is that lossless compressed image data can be recorded to a fixed-bandwidth storage medium in realtime.

A further advantage is that the encoding and decoding processes are highly parallelizable which is very desirable for software or hardware implementation.

Another advantage is that when the best quality image is desired, all the data that one needs to decompress an image and present it in original (i.e., lossless) quality is available.

The foregoing and other features and advantages of the invention will be apparent from the following, more particular description of a preferred embodiment of the invention, as illustrated in the accompanying drawings.

DETAILED DESCRIPTION OF THE PREFERRED EMBODIMENTS

The preferred embodiments of the invention are described with reference to the figures in which like reference numbers indicate like elements. Furthermore, the left most digit of each reference number indicates the number of the figure in which the number is first referenced. While specific configurations and arrangements are discussed, it should be understood that this is done for illustration purposes only. A person skilled in the art will recognize that other configurations and arrangements may be used without departing from the spirit and scope of the invention.

The present invention provides a system and method for the compression and storage of data. In a preferred embodiment, the data is video frame information, such as HDTV (high definition television) video data. Thus, the preferred embodiments of the invention are described with reference to HDTV and video examples. It will be apparent, however, to a person skilled in the art that the invention can be used to compress and store a variety of different types of data.

Figure 1:
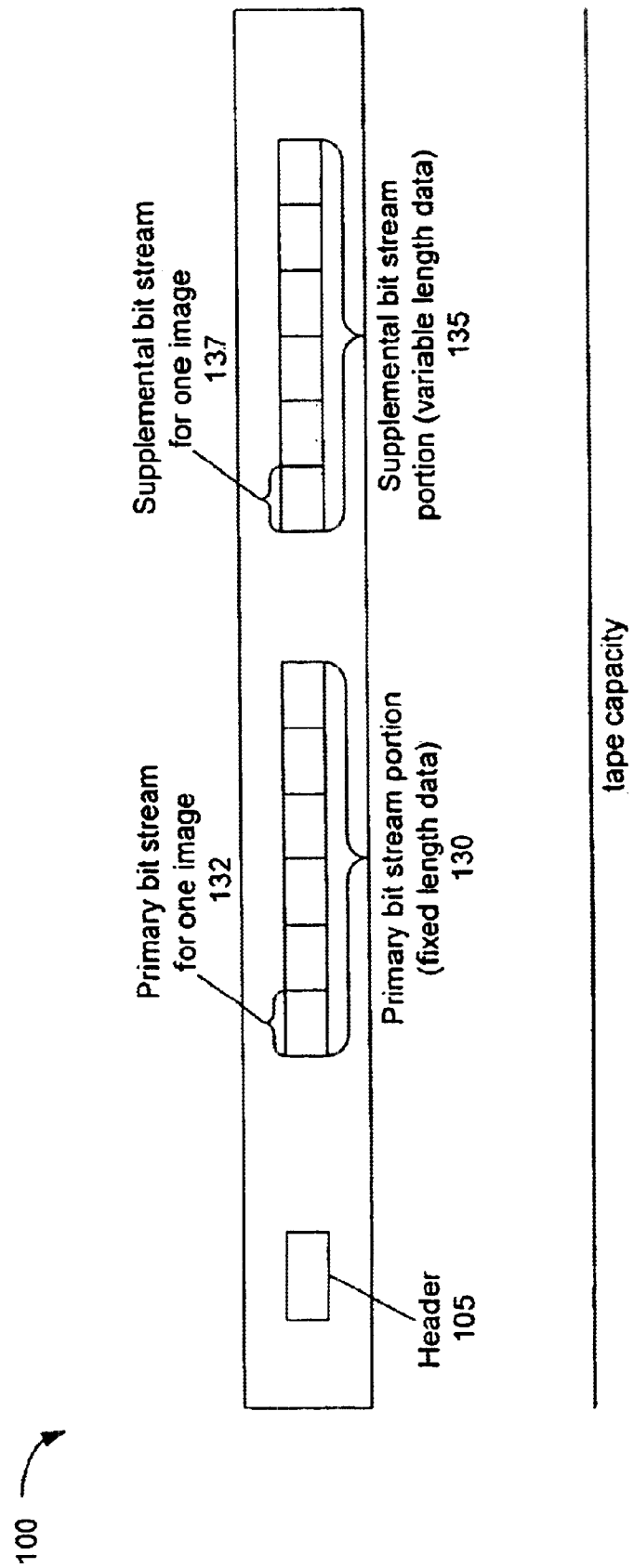
FIG. 1 illustrates how progressive lossless compressed data is organized onto a storage medium according to an embodiment of the present invention.

FIG. 1 provides an illustration of how compressed data can be organized onto a tape in accordance with an embodiment of the invention. In this example implementation, the compressed data is stored on a magnetic tape 100. However, a person skilled in the art will recognize that the invention can also be used with an optical tape, magnetic disk, optical disk, RAID (redundant array of inexpensive disks) device, and the like.

Referring now to FIG. 1, header data 105 is written at the beginning of the tape 100. Header data 105 can include information about the compressed data being recorded to tape 100. Such information can include for example, the starting location of supplemental bit stream portion 135. Next, the compressed data is written to tape 100. The compressed data includes a primary bit stream portion 130 and a supplemental bit stream portion 135. Primary bit stream portion 130 includes a primary bit stream 132 for each frame of the video data written to tape 100 in successive order. For example, bit stream one of frame one is written first. Next, bit stream one of frame two is written.

Once all of the primary bit stream data has been written onto tape 100, a plurality of supplemental bit streams 137 (e.g., one from each video frame) are written to supplemental bit stream portion 135 of tape 100. For example, bit stream two of frame one is first written into supplemental bit stream portion 135. Next, bit stream two of frame two is written. This process repeats until every supplemental bit stream for all frames have been written. When processing is completed for the entire image or sequence of images (as in the case of a movie), primary bit stream portion 130 contains sufficient data for a lossy presentation of the original data, and supplemental bit stream portion 135 contains the additional data needed for providing lossless quality data presentations.

Figure 2:
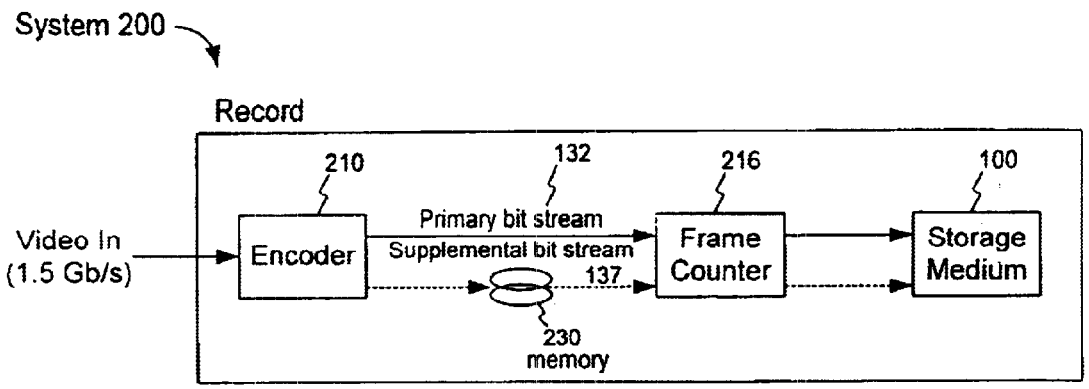
FIG. 2 is a block diagram illustrating a system for recording progressive lossless compressed data onto a storage medium according to an embodiment of the present invention.

FIG. 2 depicts a system 200 for recording compressed data onto a storage medium such as tape 100 in accordance with the present invention. An encoder 210 is used for receiving a video image to be compressed. The output of encoder 210 is a primary bit stream 132 and a supplemental bit stream 137. Bit stream 132 has a fixed length and contains sufficient data to provide a lossy quality presentation of the image or video sequence. Bit stream 137 has a variable length and contains the additional data needed to present the image or video sequence in lossless quality.

To record a frame of video data, primary bit stream 132 is copied directly onto storage medium 100. The recording of primary bit stream 132 onto storage medium 100 is done as the bit stream is received, i.e., in real-time. When supplemental bit stream 137 is received, it is temporarily stored in a memory 230. Memory 230 may be a computer hard disk or cache memory, for example.

As the bit streams for each frame are presented for recording, a frame counter 216 is incremented. Frame counter 216 begins with an initial count of zero. When processing of a batch of data (e.g., a video sequence) is completed, a total number of frames value ($F_{total}$) is set equal to the value of the frame counter. Once all of primary bit stream 132 has been recorded onto storage medium 100, then supplemental bit stream 137 is retrieved from memory 230 and written to the remaining portion of storage medium 100. A person skilled in the art will recognize that storage medium 100 may become "full" before all of supplemental bit stream 137 can be written thereon. Thus, a controller device can be used to stop recording if the tape is full.

In one embodiment of the invention, only one image or frame is processed at a time. In this example, the supplemental bit stream is written from memory to the storage medium as soon as the writing of the primary bit stream is completed.

In another embodiment, several frames are processed at a time so that the supplemental bit stream for each frame is written onto the storage medium only after the primary bit stream for every frame has been encoded and written onto storage medium 100. In both of the embodiments discussed, supplemental bit stream 137 can be written onto the end of the storage medium 100 in non-real time, i.e., after completing the encoding of the image or video sequence.

During writing of supplemental bit stream 137 to storage medium 100, frame counter 216 is used to ensure that writing of supplemental bit stream 137 has been completed for each frame. To accomplish this, frame counter 216 is again set equal to zero. It is then incremented as each frame's supplemental bit stream 137 is written to storage medium 100. When Frame counter 216 equals the total number of frames value ($F_{total}$), processing is completed.

Figure 3:
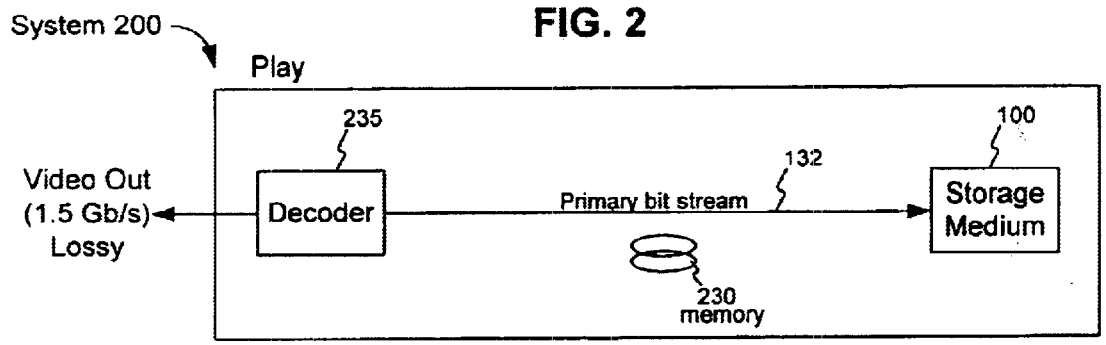
FIG. 3 is a block diagram illustrating a system for lossy quality playback of compressed data from a storage medium according to an embodiment of the present invention.
Figure 4:
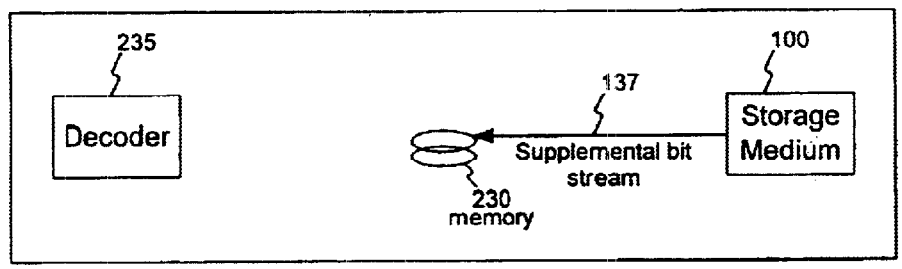
FIGS. 4 and 5 are block diagrams illustrating a system for lossless quality playback of compressed data from a storage medium according to an embodiment of the present invention.
Figure 5:
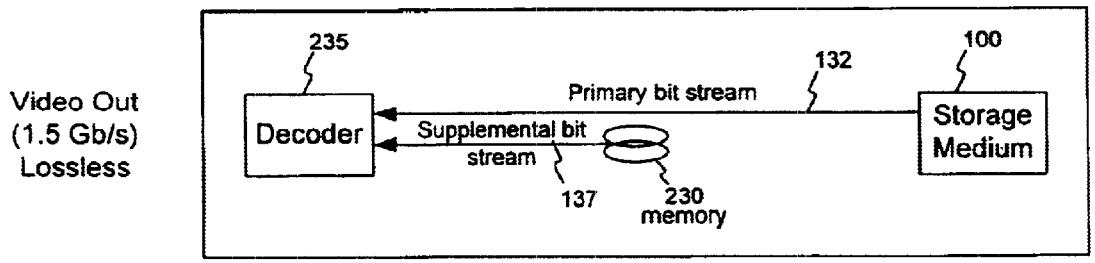

FIGS. 3–5 illustrate decompression and playback of data from storage medium 100 in accordance with the present invention. There are two playback modes available: preview mode (lossy playback) and best quality mode (lossless playback). A person seeking to view an image or video sequence would be presented with the option of choosing either.

FIG. 3 illustrates lossy playback or preview mode. When a lossy quality presentation is desired then primary bit stream 132 is retrieved from storage medium 100 and input into decoder 235. The output from decoder 235 is a video image having a quality somewhat less than the original image.

FIGS. 4 and 5 illustrate presentation of images in a lossless mode. First, as shown in FIG. 4, all of the data from supplemental bit stream 137 is copied from storage medium 100 into memory 230. Second, as depicted in FIG. 5, primary bit stream 132 from storage medium 100 and supplemental bit stream 137 from memory 230 are provided to decoder 235 for decoding together. The output from decoder 235 is a video presentation that has a quality exactly the same as the image when originally presented.

Figure 6:
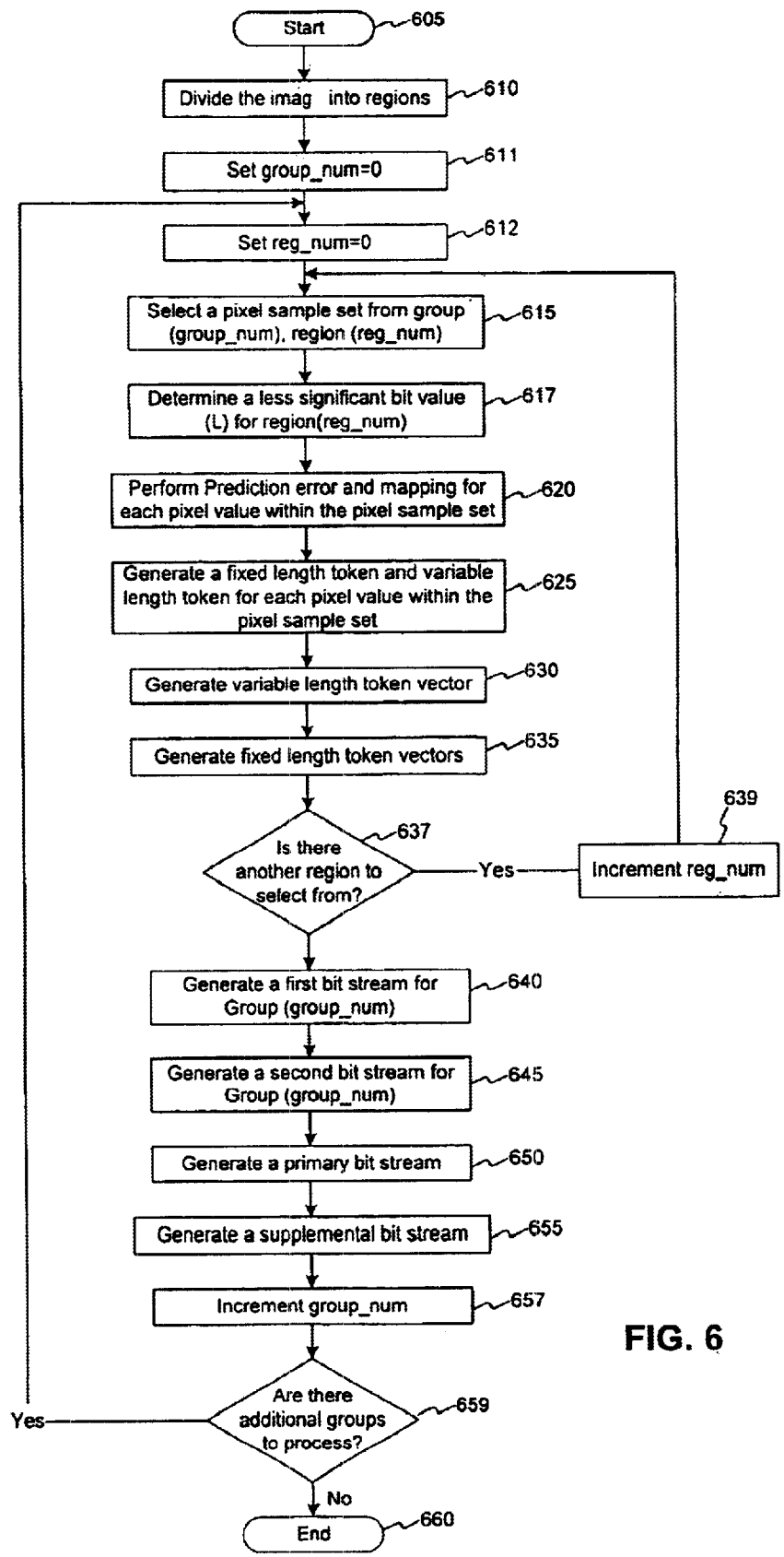
FIG. 6 is a flow diagram illustrating the general functionality of compressing data according to an embodiment of the present invention.

FIG. 6 shows a method for performing image compression according to the present invention; that is, a method for producing primary bit stream 132 and supplemental bit stream 137. In a preferred embodiment, method 600 is performed by encoder 210.

Method 600 begins at a step 605. In a step 610, the image to be compressed is divided into a plurality of regions. In a step 611, a group indicator value is initialized. In a step 612, a region indicator value is initialized. In a step 615, a pixel sample set comprising a number of pixels from a region within one group is selected. The group is identified by the present group indicator value.

In a step 617, a less significant bit value (L) is determined for the region. This value indicates the number of less significant bits within a pixel value. For an eight (8) bit pixel value, the number of less significant bits could range from 0 to 7. In a preferred embodiment, three bits are used to represent the value L. For ten (10), twelve (12), or sixteen (16) bit pixel values, the number of less significant bits could range from 0 to 15. In a preferred embodiment, four bits are used to represent the value L.

In a step 620, prediction error calculations are performed using the pixel values of the pixel sample set. In a step 625, fixed length tokens and variable length tokens are generated for each pixel within the pixel sample set. Steps 620–625 are described in greater detail below with reference to FIG. 7.

In a step 630, a variable length token vector is generated for the region. The variable length token vector is comprised of the variable length tokens generated in step 625. In a step 635, a fixed length token vector is generated for each bit position associated with a pixel value. Each fixed length token vector is formed from less significant bits corresponding to the same bit position for each of the fixed length tokens of the selected pixels.

In a step 637, a determination of whether there are additional regions to select from is made. If the region indicator value is less than the plurality of regions then there are additional selections to be made. In a step 639, the region indicator value is incremented and processing control is returned to step 615.

In a step 640, a first bit stream is generated for one group. This first bit stream is comprised of all the variable length token vectors for each region within the group. In a step 645, a second bit stream is generated for the group. This second bit stream is comprised of all the fixed length token vectors for each region within the group. Steps 630 through 645 are described in greater detail with reference to FIG. 9.

In a step 650, a primary bit stream is generated. This primary bit stream is comprised of data from the first bit stream and possibly the second bit stream. In a step 655, a supplemental bit stream is generated. This supplemental bit stream is comprised of any remaining first bit stream and second bit stream data not written into the primary bit stream. Steps 650 and 655 are further described with reference to FIG. 10.

In a step 657, the group indicator value is incremented. At a step 659, a determination of whether every pixel in the image has been compressed is made. If there are additional pixels to compress then processing control returns to step 615.

When processing is completed at a step 660, the primary bit stream contains the variable length token vectors for each region within the respective groups. The variable length token vectors correspond to the more significant bits representing the compressed image or frame. Thus, the data in the primary bit stream is sufficient to provide a lossy quality presentation. The supplemental bit stream contains the remaining variable length and fixed length token vectors. By decoding the data from the primary bit stream and the supplemental bit stream together, a lossless quality presentation is obtained.

Figure 7:
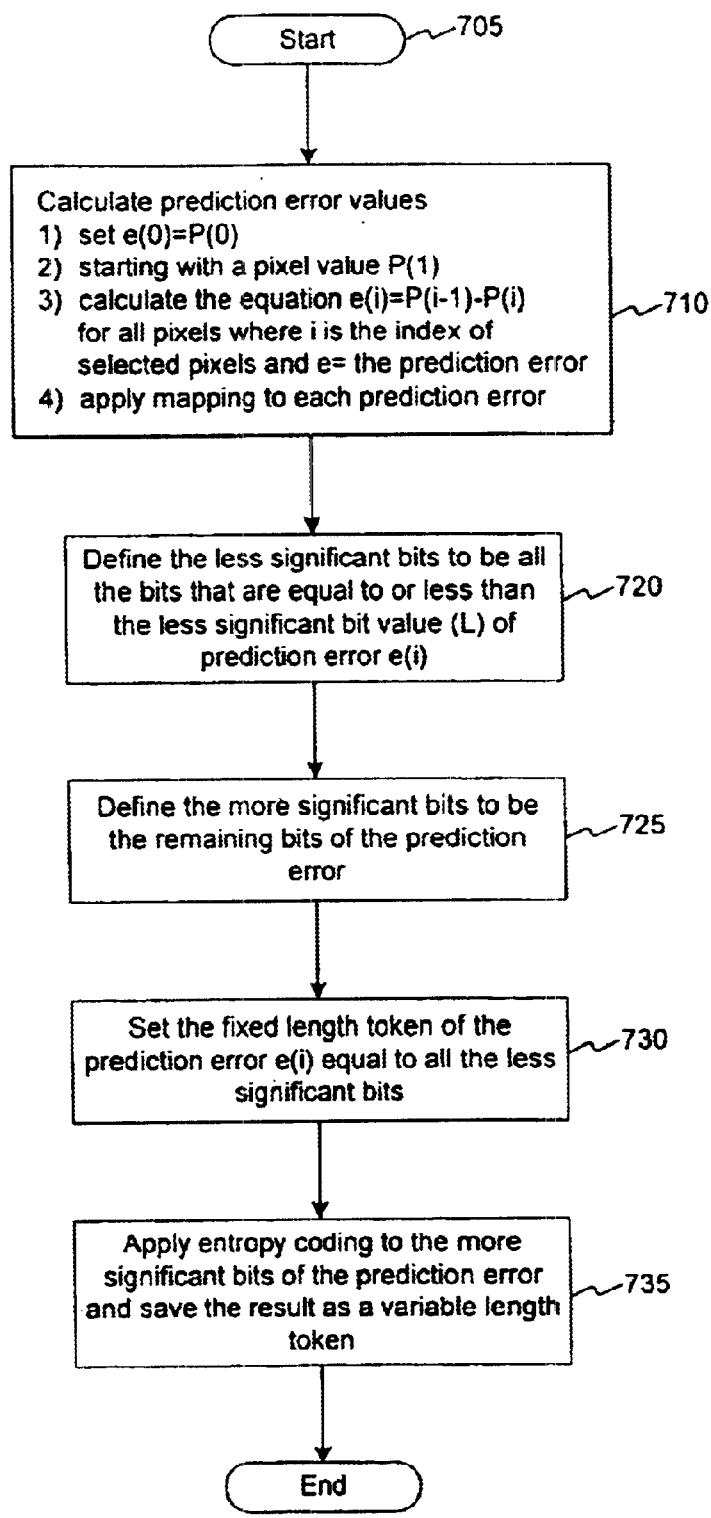
FIG. 7 is a flow diagram illustrating the general functionality of performing prediction error calculations, mapping, and token generation for one region according to an embodiment of the present invention.

FIG. 7 shows steps 620 and 625 for performing prediction error computation, mapping, and token generation according to an embodiment of the present invention. In this example, the prediction error computation and mapping are performed in accordance with well known Huffman type encoding methods, such as Rice encryption. The method begins with the presentation of a pixel value in a step 705. The pixel value can be represented by any number of bits (e.g., 8, 10, 12, etc.). In a step 710, a prediction error value is calculated for each bit according to the following steps. First, prediction error (e) for the first pixel in the pixel sample set is defined as e(0)=P(0). Then, the equation e(i)=P(i−1)−P(i) is computed, where (i) is an index and e is a prediction error value. The index corresponds to the number of pixels selected. For example, where 32 pixel values are selected, the index value will range from 1 to 31. Each bit representing the pixel value is then set equal to its calculated prediction error value. The calculated prediction error value is usually small, therefore, fewer bits can be used to encode a series of pixels. Once the prediction errors have been determined they are mapped in accordance with the Rice encoding method. Error values from eightbit values have nine bits. Mapping uses the information of the previous error value and reduces the error value to eight bits. One of ordinary skill in the art will understand the mapping functions thus, further details are not provided.

In a step 720, the bits less than or equal to the selected (L) value from step 617 are identified as the less significant bits of the prediction error. In a step 725, the remaining bits are defined to be the more significant bits of the prediction error. In a step 730, the less significant bits of the prediction error are identified as fixed length tokens. In a step 735, all of the more significant bits of the prediction error are variable length encoded using an entropy coding routine. Entropy coding produces variable length tokens representing the more significant bits. The variable length tokens are Huffman type code words. Method 700 ends at a step 740.

Figure 8:
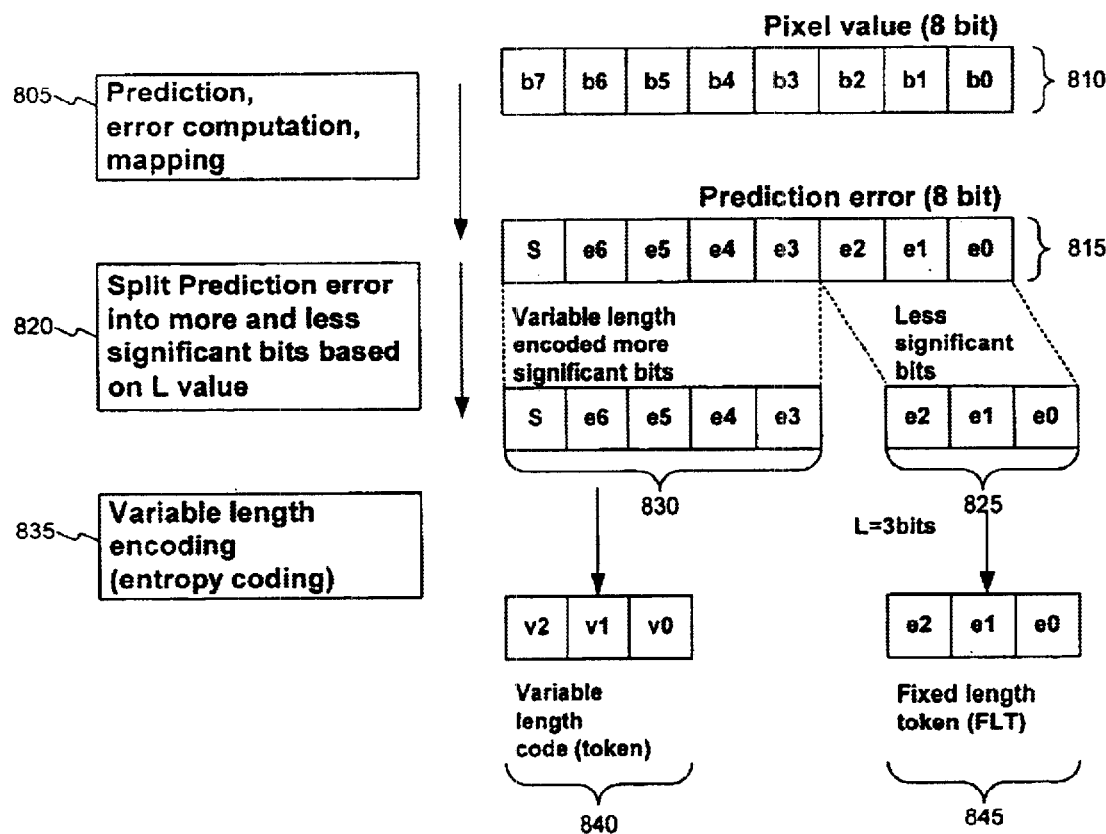
FIG. 8 is a data flow diagram illustrating the processing of pixel value prediction error calculations and encoding of a pixel value according to an embodiment of the present invention.

FIG. 8 provides a data flow diagram illustrating the prediction error step 620 and token generation process step 625 as described in FIG. 7. Here, prediction error computation is performed on an 8 bit pixel value 810 as indicated at block 805. A prediction error value 815 is calculated for each bit according to step 710 described above. Next, the prediction error value is split into more significant bits and less significant bits according to a less significant bit value (L). For eight (8) bit pixel values, the number of less significant bits is three (3). Accordingly, the right most number of bits equal to the selected (L) values are identified as the less significant bits 825. The remaining bits are defined to be the more significant bits 830. Next, more significant bits 830 are variable length encoded using an entropy coding routine as indicated at block 835. Entropy coding produces variable length tokens 840 representing the more significant bits. The less significant bits of the prediction error are designated as fixed length tokens 845.

Figure 9:
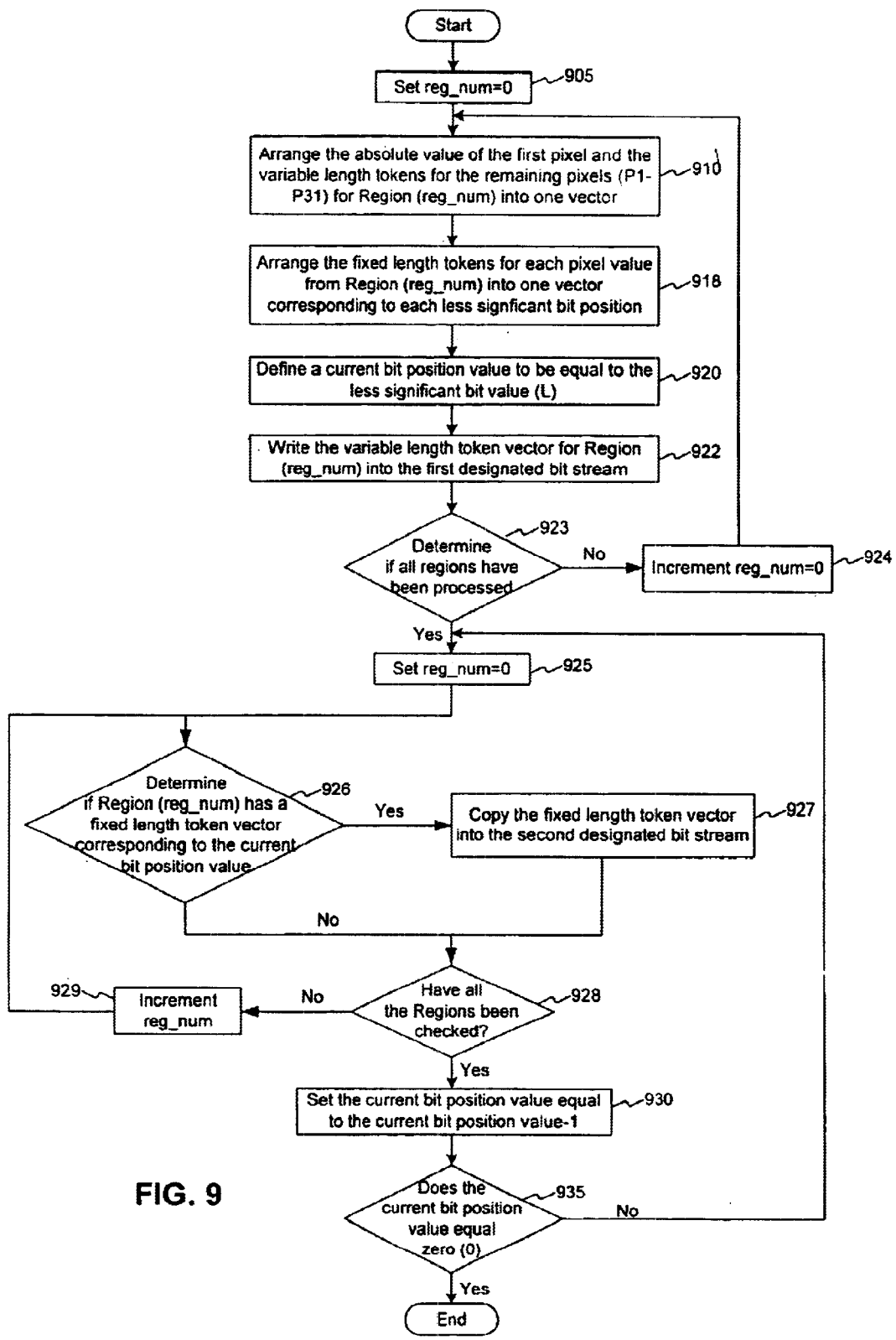
FIG. 9 is a flow diagram illustrating the general functionality of generating and packing fixed length token vectors and variable length token vectors for one group of regions according to an embodiment of the present invention.

FIG. 9 further describes the steps 630 and 635 of generating the variable length token vectors and fixed length token vectors. In a step 905, a region indicator number is initialized. In a step 910, a variable length token vector is generated for a region by concatenating the absolute value of the first pixel value and the variable length tokens for the remaining pixel values. The variable length tokens are arranged in ascending order within the variable length token vector based upon their respective pixel bit positions (e.g., $P_0$ to $P_{31}$).

In a step 918, a fixed length token vector for one region is generated by copying one bit of each fixed length token and concatenate those bits into a fixed length token vector. There will be a fixed length token vector corresponding to each less significant bit position. The remaining steps involve packing the variable length token vectors into a first bit stream (bit stream 1) and the fixed length token vectors into a second bit stream (bit stream 2) in accordance with steps 640 and 645.

First, in a step 920, a current bit position value is set equal to the less significant number bit value (L) associated with the region. Next, in a step 922, the variable length token vector for the region is packed into a first bit stream (bit stream 1). In a step 923, a determination is made of whether the variable length token vector packing process has been completed for each region. If not, then in a step 924, the region indicator number is incremented and control is returned to step 910. When the result of determination step 923 is yes, the variable length token vectors for each region will have been arranged in ascending order within bit stream 1 based upon their respective region. (e.g., $R_0$ to $R_{max}$).

In a step 925, the region indicator number is initialized again. Beginning with the region corresponding to the region indicator number, in a step 926, a determination is made of whether the region has a fixed length token vector corresponding to the current bit position value. If the result is yes, then in a step 927, the fixed length token vector from that region is copied into bit stream 2. In a step 928, a determination of whether all the regions have been checked is made. If the region indicator number is equal to the plurality of regions then all the regions have been checked. If there are additional regions to check then at a step 929, the region indicator number is incremented and processing is returned to step 926.

In a step 930, the current bit position value is set equal to the current bit position value minus one. In a step 935, a determination of whether the current bit position value equals zero is made. If it does not then processing is returned to step 925. When processing ends at a step 940, bit stream I has been generated and contains all the variable length token vectors for each region within a particular group. Likewise, bit stream 2 has been generated and contains all of the fixed length token vectors for each region within the same group.

Figure 10:
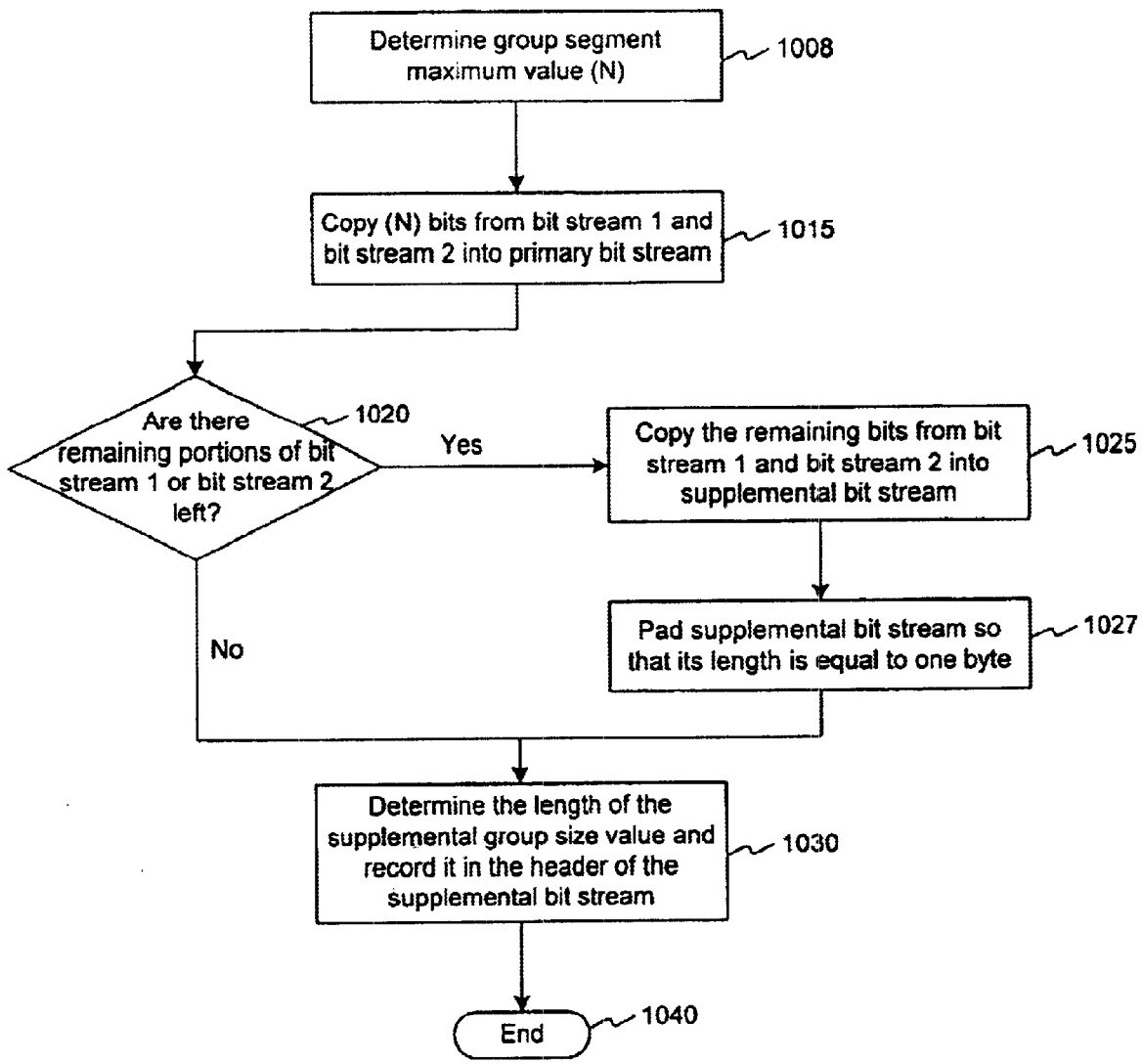
FIG. 10 is a flow diagram illustrating the general functionality of generating a primary bit stream and a supplemental bit stream according to an embodiment of the present invention.

FIG. 10 describes the steps 650 and 655 for generation of a primary and possibly supplemental bit stream according to the present invention. The primary bit stream is comprised of segments having a fixed length. In a step 1008, the maximum size of each groups segment (N) is defined. The size of the group segment is dependent upon the bandwidth limitations imposed by the storage media used to store the compressed data.

In a step 1015, N bits are retrieved from bit stream 1 and bit stream 2 and copied into the group allocated segment within the primary bit stream. In a step 1020, a determination of whether additional data remains to be copied is made. If the value N is less than the combined length of bit stream 1 and bit stream 2, then there will be additional data to copy.

The supplemental bit stream can be expanded to any length necessary to hold the remaining data from bit streams 1 and 2. Thus, the supplemental bit stream will have a variable length. If additional data needs to be copied then in a step 1025, the remaining portions of bit stream 1 and/or bit stream 2 are written into a supplemental bit stream. Next, in a step 1027, the end of the supplemental bit stream is padded with bits so that the length of the group's segment within the supplemental bit stream is equal to 1 byte. In a step 1030, each group's segment length within the supplemental bit stream is determined and appended to the header portion of the supplemental bit stream. The group segment length value can be determined by subtracting (N) from the combined length of bit steam 1 and bit stream 2. In the case where no additional data was copied, the group segment length value would be equal to zero. The group segment length values are useful for providing random or arbitrary access to the respective group portions of the supplemental bit stream. This ability to access the data is this manner makes parallizing possible. When processing is completed at a step 1040, the primary bit stream, and if generated, the supplemental bit stream, will contain data corresponding to each group identified during the compression process.

The maximum number of groups to be identified is dependant upon the type of image frame being compressed. For example, a standard definition NTSC video frame has (720×487 pixels). If 32 pixel values are taken from 4 regions, the maximum number of groups for the image would be:

Gmax=720*487*3 (color components)/(4*32)=8218.12 or 8,219 groups.

In another example, an HDTV video frame has (1920× 1080 pixels). If 32 pixel values are taken from 4 regions, the maximum number of groups for the image would be:

Gmax=1920*1080*3/(4*32)=48,600 groups.

Figure 11:
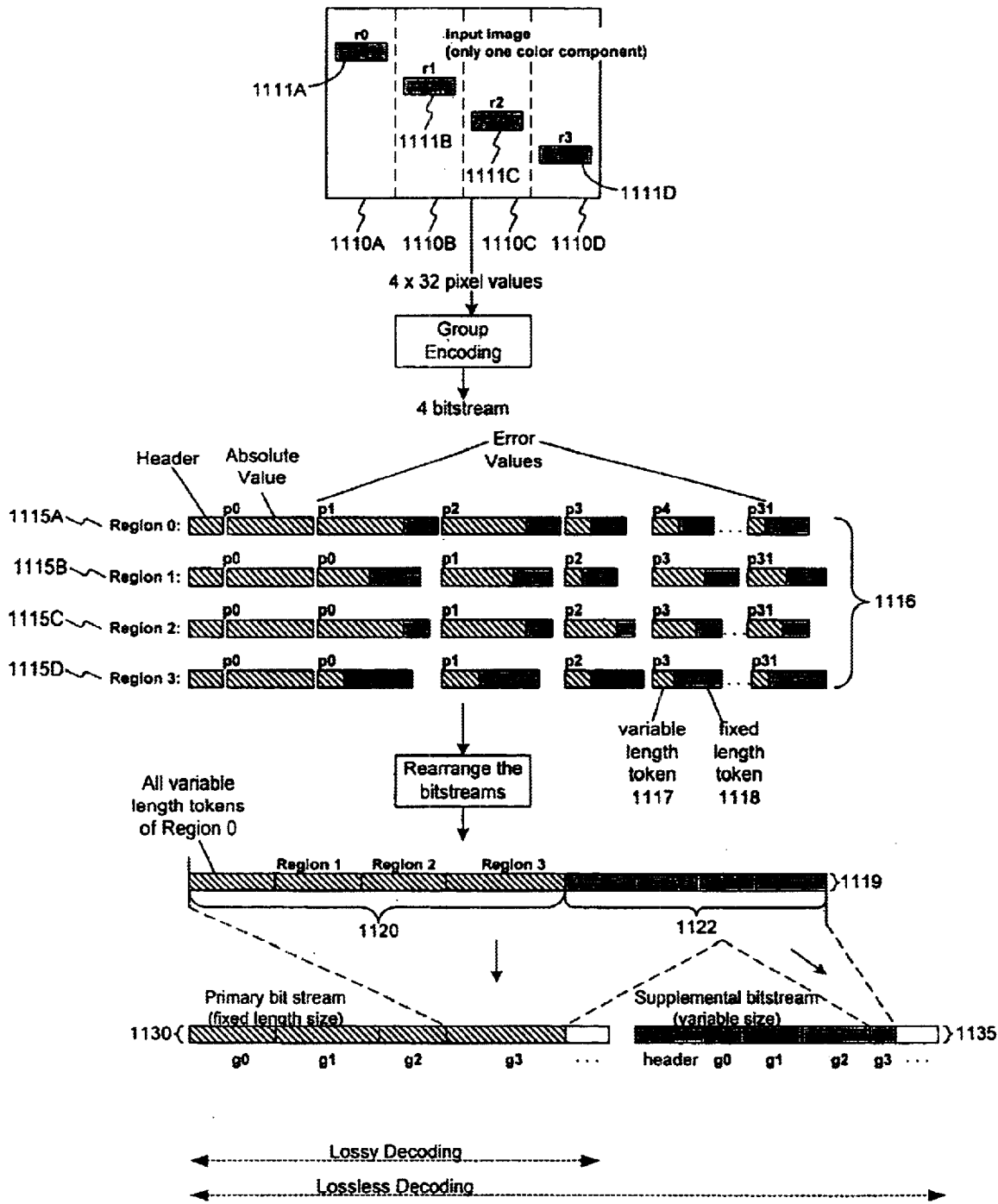
FIG. 11 is a data flow diagram illustrating an image being compressed into a primary bit stream and a supplemental bit stream used for both lossy and lossless presentation according to an embodiment of the present invention.

An example application of the above described method will now be discussed with respect to FIG. 11. An image 1105 having three (3) color components (e.g., Red, Green, and Blue) per pixel has been presented for compression. There are eight (8) bits used to represent each color component. One color component is processed at a time. The input image 1105 is divided into a plurality of regions 1110. For purpose of illustration, regions 1110A–1110D are depicted. (also referred to as regions $r_0$–$r_3$) From each of these regions, a pixel sample set 1111 is selected by choosing a plurality of adjacent pixels for encoding.

The pixel sample sets 1111A–1111D can be selected from anywhere within the respective regions. In a preferred embodiment, a symmetrical selection routine is used. Accordingly, beginning with the first region 1110A, a pixel sample set 1111A is selected from the fourth row. In a preferred embodiment, 32 adjacent pixels are selected. Next, from the second region 1110B, a pixel sample set 1111B is selected from an offset of the first region 1110A. The offset can be four rows for example. The goal is to obtain a representative sample of the whole image. From the third region 1110C, a pixel sample set 1111C is selected from row twelve (12). Finally, pixel set 1111D is selected from row sixteen (16) of region 1110D. Selection of pixel sample sets for a next group will begin on the next row of each respective region. When the last row of a region has been reached, the next pixel sample set selection is made from the top of the region and continues down until all pixels have been processed.

The encoding routine is performed for this first group as described in steps 710–735 and produces a bit stream corresponding to each respective region. For example, by inputting four 32 pixel value sets 1111A, 1111B, 1111C, and 1111D, the output would be four encoded bit streams 1115A–1115D corresponding to Region 0 through Region 3 ($R_0$–$R_3$).

As shown, each bit stream 1115A–1115D has a header portion indicating the number of less significant bits represented within the bit stream. The bit streams further include the absolute value of the first pixel value in the set (P0) and tokens representing the calculated prediction error values for pixel values one (P1) through thirty-one (P31). The tokens are designated as either variable length 1117 or fixed length 1118.

Each of the four bit streams 1115A–1115D resulting from the encoding process are rearranged and combined to produce a single bit stream 1119 according to the routine described in steps 905–935. Bit stream 1119 is comprised of two portions. The first portion 1120 contains the variable length token vectors corresponding to the variable length tokens 1117. The second portion 1122 contains specially arranged fixed length token vectors corresponding to the fixed length tokens 1118. The fixed length token arranging scheme is further described with respect to FIG. 12. A primary bit stream 1130 is comprised of data from the first portion 1120 and the second portion 1122 of bit stream 1119. A supplemental bit stream 1135 is comprised of the remaining data from the second portion 1122 of bit stream 1119. Primary bit stream 1130 has sufficient data to provide a lossy quality presentation. Similarly, primary bit stream 1130 and supplemental bit stream 1135 taken together can be decoded to provide a lossless quality presentation.

Figure 12:
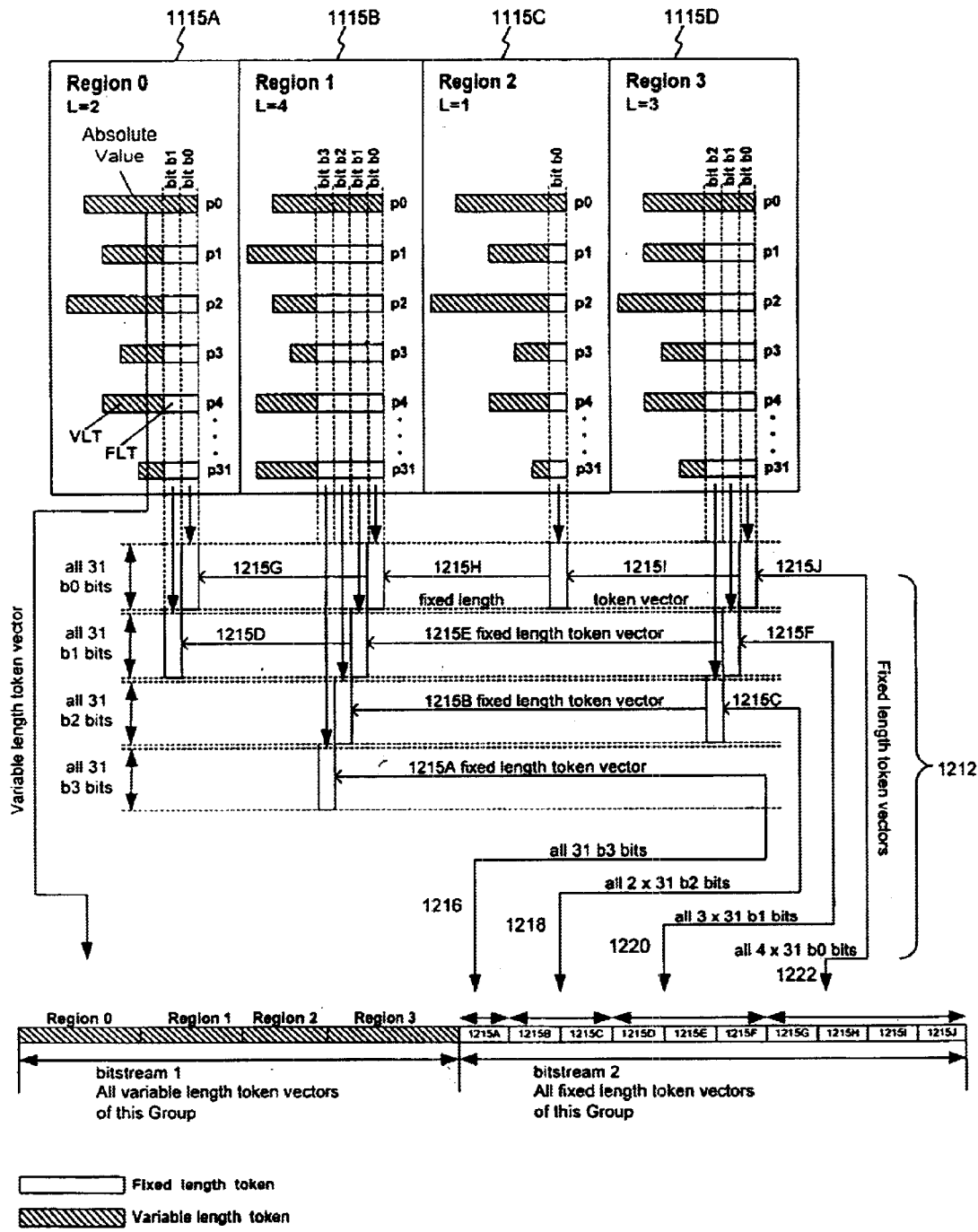
FIG. 12 is a data flow diagram illustrating the reordering of fixed length token vectors for one group according to an embodiment of the present invention.

FIG. 12 provides a data flow diagram for the reordering of the second portion 1122 of bit stream 1119 according to the present invention. Data from the regions 1115A–1115D is depicted. In block 1212, a fixed length token vector 1215 is generated for each region 1115 by concatenating the fixed length tokens 1118 for each pixel bit (P11)–(P31). Each region has a fixed length token vector 1215 corresponding to each less significant bit position.

To pack the fixed length token vectors, a current bit position value is set equal to the highest value (L) associated with each region within a group as described in step 920 of FIG. 9. Here, the current bit position value equals four. Next, as described in step 925, beginning with the first region 1115A, a determination is made of whether the region has a fixed length token vector 1215 corresponding to the current bit position value. If the result is yes, then as referenced in step 927, the fixed length token vector from that region is copied into the second bit stream. The above steps are repeated for the next region until all of the regions have been considered. In this case, the first vector corresponding to current bit position value is found in the second region 1115B (fixed length token vector 1215A). This vector is combined with any other corresponding vectors (in this case there are none) to produce combined vector 1216. Combined vector 1216 is written into the fixed length portion 1122 of bit stream 1119. Next, the current bit position is set equal to the current bit position value minus one. The above fixed length token vector packing process is repeated until the current bit position value equals zero. Thus, combined vectors 1218, 1220 and 1222 are generated. Combined vector 1218 is comprised of fixed length token vectors 1215B and 1215C. Combined vector 1220 is comprised of fixed length token vectors 1215D–1215F. Combined vector 1222 is comprised of fixed length token vectors 1215G–1215J.

While various embodiments of the present invention have been described above it should be understood that they have been presented by way of example and not limitation. It will be apparent to persons skilled in the relevant arts that various changes in form and detail can be made therein without departing from the spirit and scope of the invention. Thus, the present invention should not be limited by any of the above described exemplary embodiments but should be defined only in accordance with the following claims and their equivalents.

What is claimed is:

1. A method for compressing an image, comprising the steps of:
   (a) dividing the image into a plurality of regions;
   (b) for each region
      (i) selecting a plurality of adjacent pixels corresponding to the same color component, wherein said selected pixels from a particular region form a pixel sample set, and wherein corresponding pixel sample sets from said plurality of regions form a group,
      (ii) for each selected pixel, encoding a pixel value of said selected pixel to generate a fixed length token and a variable length token,
      (iii) associating said variable length tokens for each pixel value in said pixel sample set to form a variable length token vector, and
      (iv) arranging bits of said fixed length tokens to associate each bit of a pixel value with corresponding bits of other pixels values within said pixel sample set to form a fixed length token vector for each bit position of said fixed length tokens;
   (c) for each group
      (i) forming a first bit stream including said variable length token vector of each of said plurality of regions, and
      (ii) forming a second bit stream including said fixed length token vectors of each of said plurality of regions;
   (d) forming a primary bit stream of constant length and if required, a supplemental bit stream of inconstant length, wherein both bit streams may include said first and second bit streams corresponding to each of said groups; and
   (e) repeating steps (b)–(d) for a next pixel sample set selected from each region until the pixels of each of said plurality of regions have been encoded and added to said primary bit stream and said supplemental bit stream.

2. The method of claim 1 wherein said variable length token for a first of said selected pixels has a value equal to the absolute value of said pixel value.

3. The method of claim 2 wherein the following steps are performed prior to said step (b) (ii):
   determining a less significant bit value; and
   designating each of a first number of bits corresponding to said less significant bit value as a less significant bit and each remaining bit position as a more significant bit.

4. The method of claim 3 wherein said less significant bit value is copied into a header portion of said first bit stream.

5. The method of claim 4, wherein said pixel value encoding step (b) (ii) includes the following steps:
   (1) subtracting a predicted pixel value from an actual pixel value and saving said result as a prediction error value;
   (2) generating said variable length token by entropy encoding said prediction error value of said more significant bits; and
   (3) setting said fixed length token equal to the less significant bits of said prediction error.

6. The method of claim 5 wherein all of said variable length token vectors from said plurality of regions within said group are combined to form said first bit stream.

7. The method of claim 6 wherein all of said fixed length token vectors from said plurality of regions within said group are arranged according to the following steps:
   (a) setting a current bit position value equal to said less significant bit value;
   (b) beginning with a first of said plurality of regions
      (i) determining if said region has said fixed length token vector corresponding to said current bit position value and if so, copying said fixed length token vector into said second bit stream, and
      (ii) repeating step (i) for the next of said plurality of regions until said determining step (i) has been completed for each of said plurality of regions;
   (c) setting said current bit position value equal to said current bit position value minus one; and
   (d) repeating steps (a)–(c) until said current bit position value equals zero.

8. The method of claim 7 wherein said first bit stream of variable length token vectors followed by said second bit stream of fixed length token vectors are copied into said primary bit stream until all of said first bit stream variable length token vectors and all of said second bit stream fixed length token vectors have been copied or the number of copied fixed length and variable length token vectors equals a primary bit stream length maximum.

9. The method of claim 8 wherein if the number of copied fixed length and variable length token vectors equals said primary bit stream length maximum, then any remaining first bit stream variable length token vectors and second bit stream fixed length token vectors are copied into said supplemental bit stream until all of said first variable length token vectors and all of said second bit stream fixed length token vectors have been copied.

10. The method of claim 9 wherein for each group said supplemental bit stream is backfilled so that a supplemental group length value is equal to one byte.

11. The method of claim 10 wherein for each group said supplemental bit stream length value is copied into a supplemental bit stream header portion.

12. The method of claim 11 wherein said supplemental group length values can be used to locate portions of said supplemental bit stream corresponding to any of said groups.

13. The method of claim 1 wherein thirty-two pixels are selected.

14. The method of claim 1 wherein the number of bits per said pixel value equals 8, 10, 12, or 16.

* * * * *

Disclaimer 6,683,980 B1—Fabian W. Meier, San Francisco, Ca. SYSTEM AND METHOD FOR COMPRESSING DATA. Patent dated Jan. 27, 2004. Disclaimer filed October 28, 2004, by the assignee Microsoft Corporation.

The term of this patent, subsequent to the term of the patent number 6,683,980, has been disclaimed.

*(Official Gazette March 15, 2005)*